(12) United States Patent
Jansen

(10) Patent No.: US 10,374,552 B1
(45) Date of Patent: Aug. 6, 2019

(54) MIXER DRIVER CIRCUIT WITH IMPROVED SLEW RATE

(71) Applicant: BAE Systems Information and Electronic Systems Integration Inc., Nashua, NH (US)

(72) Inventor: Douglas S. Jansen, Pelham, NH (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 4 days.

(21) Appl. No.: 15/952,868

(22) Filed: Apr. 13, 2018

(51) Int. Cl.
| | | |
|---|---|---|
| *H03D 7/14* | (2006.01) | |
| *H01L 27/06* | (2006.01) | |
| *H04B 1/16* | (2006.01) | |
| *H01L 21/8249* | (2006.01) | |
| *H01L 29/737* | (2006.01) | |

(52) U.S. Cl.
CPC ......... *H03D 7/145* (2013.01); *H01L 21/8249* (2013.01); *H01L 27/0623* (2013.01); *H04B 1/16* (2013.01); *H01L 29/737* (2013.01); *H03D 7/1458* (2013.01)

(58) Field of Classification Search
CPC ...... H04B 1/28; H03D 7/145; H01L 21/8249; H01L 27/0623
USPC .......................................................... 375/316
See application file for complete search history.

(56) References Cited

U.S. PATENT DOCUMENTS

| 6,044,255 A * | 3/2000 | Suematsu ................ H04B 1/28 330/300 |
| 2002/0146997 A1* | 10/2002 | Koizumi ................ H03D 7/125 455/323 |
| 2004/0192244 A1* | 9/2004 | Tan ....................... H03D 7/1441 455/333 |

* cited by examiner

Primary Examiner — Kevin M Burd
(74) Attorney, Agent, or Firm — Finch & Maloney PLLC

(57) ABSTRACT

A mixer device is disclosed, which is fabricated as a bipolar-complementary metal oxide semiconductor (BiC-MOS) integrated circuit device, to provide improved linearity and dynamic range, at higher operating frequencies. A mixer device configured according to an embodiment includes a driver circuit comprising bipolar junction transistors (BJTs) to convert a local oscillator signal to a high slew-rate gate drive signal. The driver circuit is configured as a quasi-complementary driver employing NPN BJTs. The mixer device further includes a mixer circuit comprising CMOS field-effect transistors (FETs) configured to mix an input signal with the gate drive signal to generate an output signal through the application of the gate drive signal to the gate port of the CMOS FETs. The mixer device further includes a voltage biasing circuit to provide a biased body voltage to the FETs to allow overdriving to a negative voltage relative to the body voltage.

20 Claims, 10 Drawing Sheets

300

MIXER DRIVER CIRCUIT WITH IMPROVED SLEW RATE

STATEMENT OF GOVERNMENT INTEREST

This invention was made with United States Government assistance under Contract No. HR0011-12-C-0083 awarded by the Defense Advanced Research Projects Agency (DARPA). The United States Government has certain rights in this invention.

FIELD OF DISCLOSURE

The present disclosure relates to mixer devices, and more particularly, to high slew-rate driver circuits for mixer devices, fabricated as bipolar-complementary metal oxide semiconductor (BiCMOS) integrated circuit devices.

BACKGROUND

Mixing device circuits can be used to transform an input signal at a given frequency into one or more output signals at another desired frequency by mixing the input signal with a local oscillator (LO) signal. For example, a radio frequency (RF) signal may be down converted to an intermediate frequency (IF) signal, or an IF signal may be up converted to an RF signal. In general, the frequency of the output signal is offset from the frequency of the input signal by the frequency of the LO signal. Existing complementary metal oxide semiconductor (CMOS) field-effect transistor (FET) based mixer devices typically suffer from nonlinearities at higher frequencies. This problem may arise, for example, from the use of a gate drive signal, derived from an LO, to drive the mixer gates of the FET devices. In particular, it is possible that this gate drive signal can drive the FETs into an undesirable non-linear region of operation, for a significant portion of each cycle of the LO. This in turn generally constrains gate drive signals to a relatively low level, which in turn limits the dynamic range of the circuit in which the mixer is included.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts.

Figure 1:
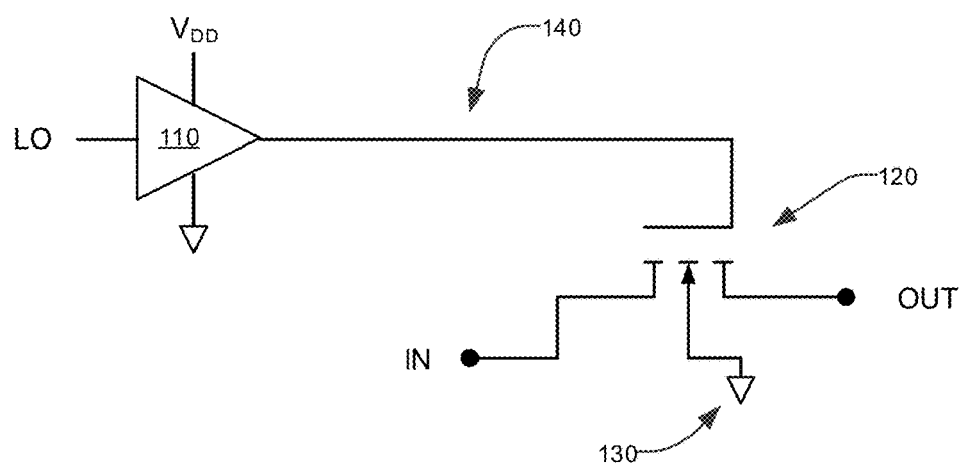
FIG. 1 is a circuit diagram of a mixer device susceptible to drive signal constraints and the problems that flow therefrom.

Although the following Detailed Description will proceed with reference being made to illustrative embodiments, many alternatives, modifications, and variations thereof will be apparent to those skilled in the art.

DETAILED DESCRIPTION

Mixer devices are disclosed which are fabricated as bipolar-complementary metal oxide semiconductor (BiCMOS) integrated circuit devices, to provide improved linearity and dynamic range, particularly at higher operating frequencies. In an embodiment, the mixer device generally includes a two-stage architecture having a driver portion and a mixer portion. The driver portion includes bipolar junction transistors (BJTs) to transform a local oscillator (LO) sinusoidal signal into a high slew rate gate drive signal for the follow-on mixer stage. This generated gate drive signal more closely approximates a square wave. The mixer portion of the circuit includes complementary metal oxide semiconductor (CMOS) field-effect transistors (FETs) configured to mix an input signal with the high slew rate gate drive signal to generate an output signal at a desired frequency offset. The frequency offset is based on the frequency of the LO signal. The use of bipolar devices (e.g., BJTs) in a BiCMOS topology allows for the application of larger amplitude drive signals with higher slew rates to the mixer gates, compared to CMOS devices, since most CMOS devices with higher breakdown voltages tend to exhibit slower performance characteristics. These squared-up drive signals transition the FET devices of the mixer circuit through their non-linear region of operation more quickly, which improves the linearity of the resulting output signal, particularly at higher frequencies, such as, for example above 5-10 GHz, as will be explained in greater detail below.

The disclosed mixer devices can be employed, for example, in a communication or computing platform, including a receiver (demodulator) and/or a transmitter (modulator), although any number of other applications having a need for frequency transformation of signals with improved linearity will be apparent. In accordance with an embodiment, a mixer device includes a driver circuit comprising one or more BJTs to convert an LO signal to a gate drive signal. The driver circuit is configured as a quasi-complementary driver employing NPN BJTs. The mixer device further includes a mixer circuit comprising one or more CMOS FETs configured to mix an input signal with the gate drive signal to generate an output signal through the application of the gate drive signal to the gate ports of the CMOS FETs. The mixer device further includes a voltage biasing circuit to provide a biased body voltage to the FETs to allow overdriving the gate signal to a negative voltage relative to the body voltage of the FET, thus pushing the FET further into a hard off-state (e.g., over-shooting) which improves linearity, as will be explained in greater detail below.

As will be appreciated in light of this disclosure, the mixer devices described herein may allow for improved performance, compared to existing mixer circuits such as those that use CMOS FET drivers which generally produce gate drive signals with lower amplitude and lower slew rate. The disclosed mixer devices may therefore be more suitable for use in a variety of applications such as high-performance radio receivers and transmitters, frequency synthesizers for electronic warfare systems, mixed-mode digital to analog converters, and microwave communication systems, for example. The disclosed mixer devices can be implemented on a broad range of platforms including radios, data communication devices, smart phones, personal computers, laptop computers, tablets, and so forth.

FIG. 1 is a circuit diagram of an example mixer device 100. As will be explained herein, such a circuit design is susceptible to drive signal constraints. The mixer device 100 is shown to include an FET driver 110 and an FET mixer 120, and is configured to operate as a switching mixer. A switching mixer alternately multiplies the input signal by +1 and 0, depending on the phase of the LO, which results in a frequency shift of the input signal by the frequency of the LO (along with the generation of harmonics that can later be filtered out).

Figure 2:
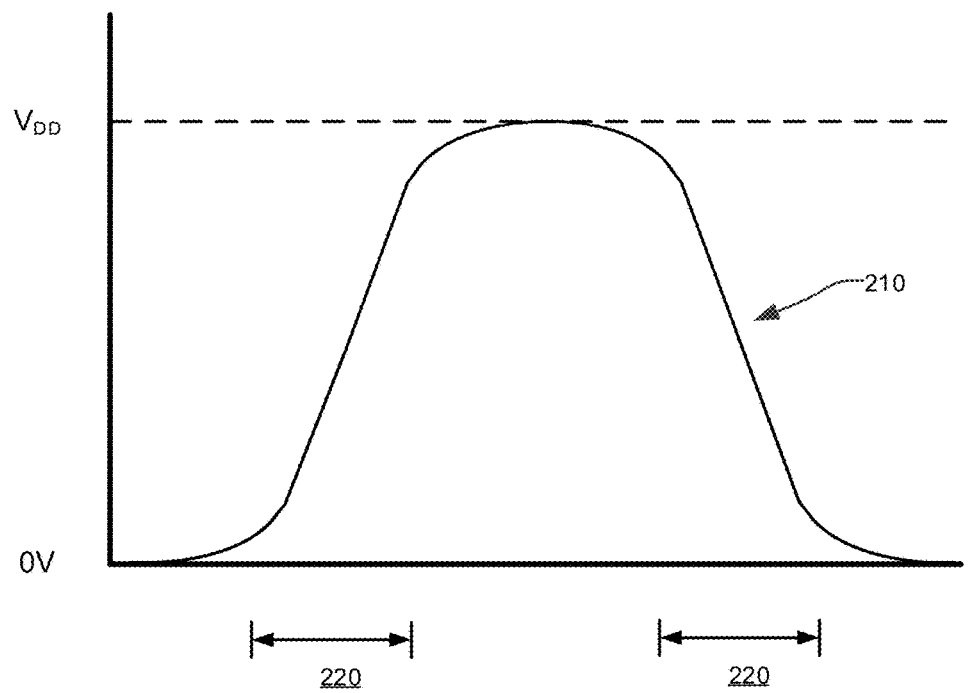
FIG. 2 is a plot illustrating the output gate drive signal of a mixer device like the one depicted in FIG. 1.

FET driver 110 is configured to accept a sinusoidal LO signal and generate a gate drive signal 140, which is an approximately squared-up version of the LO signal, as illustrated in FIG. 2 and described below. The gate drive signal 140 is applied to the gate of the FET mixer 120. FET mixer 120 is configured to mix the gate drive signal 140 with the input signal (IN) to generate the output signal (OUT). The body of the FET mixer 120 is shown to be grounded 130.

Mixer devices that employ CMOS FET drivers 110 suffer from a number of problems, including undesirable nonlinearities at higher frequencies, resulting from gate drive signal characteristics which are illustrated in FIG. 2.

FIG. 2 is a plot illustrating the output gate drive signal 140 of the FET driver circuit 110 of the mixer device 100. One cycle of the gate drive signal is shown to range from a minimum of 0 volts up to a maximum of $V_{DD}$ volts (the driver FET drain supply voltage). Since the body of the FET is grounded to 0 volts, this gate drive signal fails to provide a desirable FET gate overvoltage condition, which will be described in greater detail below. Additionally, the transition region between these two extremes is shown to have a relatively gradual slope 210 (e.g., a poor slew rate), which results in the FET mixers 120 transitioning through an undesirable nonlinear region of operation over a relatively long period of time 220.

Figure 3A:
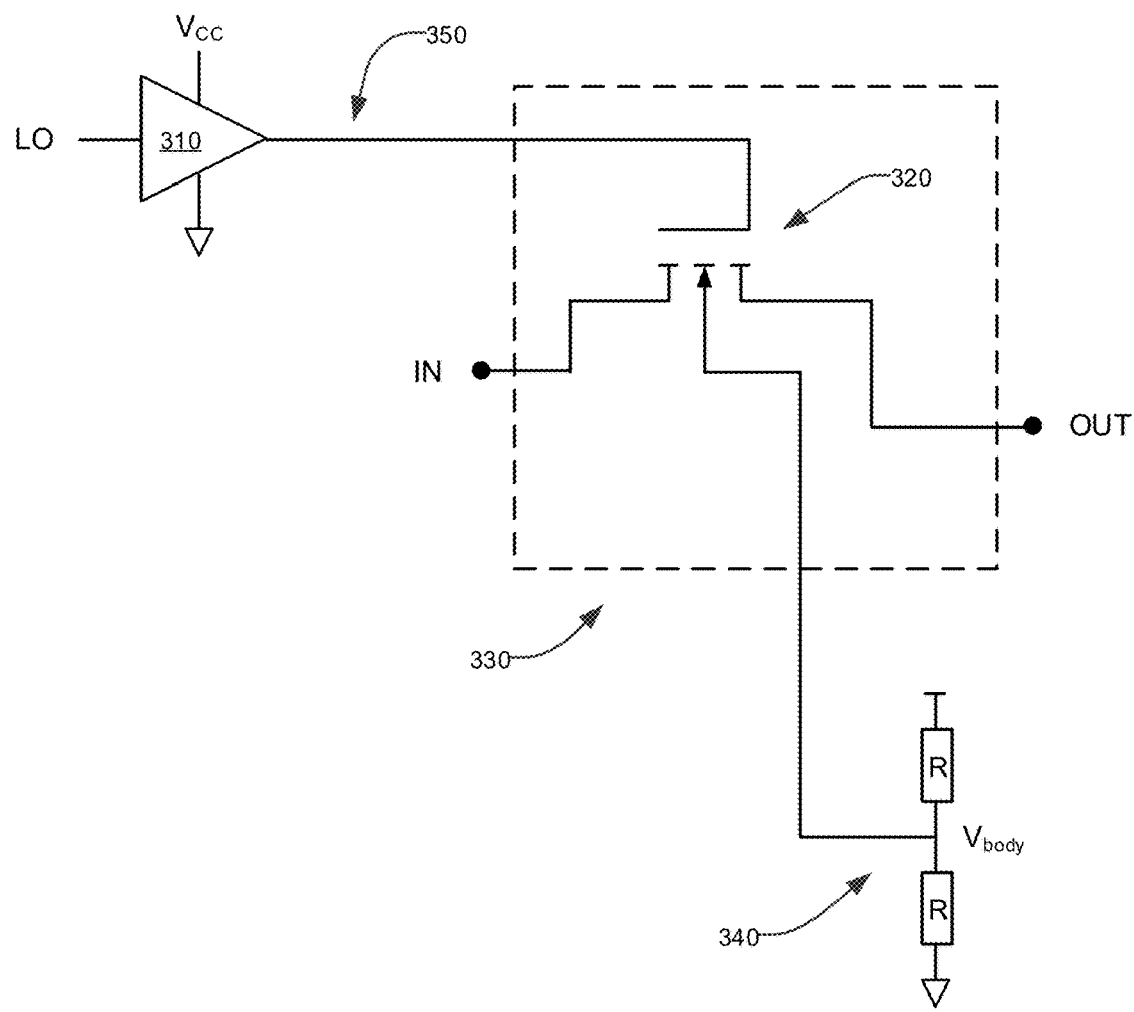
FIG. 3A is a circuit diagram of a mixer device with a high slew rate driver circuit, configured in accordance with an embodiment of the present disclosure.

FIG. 3A is a circuit diagram of a mixer device 300, configured in accordance with certain of the embodiments disclosed herein. The mixer device 300 is shown to include a BJT-based driver circuit 310 and an FET mixer circuit 320, and is configured to operate as a switching mixer, as previously described. Also shown is a voltage biasing circuit 340 configured to provide a voltage bias to the bodies of FET mixer circuit 320. In some embodiments, the voltage biasing circuit 340 may be implemented as a pair of resistors configured as a voltage divider, as shown.

BJT driver circuit 310 is configured to accept an LO signal (e.g., a sinusoidal wave at a selected frequency) and generate a squared-up gate drive signal 350 based on the LO signal. The gate drive signal 350 is used to drive the gate of the FET mixer circuit 320. FET mixer circuit 320 is configured to mix the gate drive signal 350 with the input signal (IN) to generate the mixed output signal (OUT) at sum and difference frequencies of the input and LO signals. The body of the FET mixer circuit 320 is shown to be voltage biased through voltage biasing circuit 340, as will be explained below.

Figure 5:
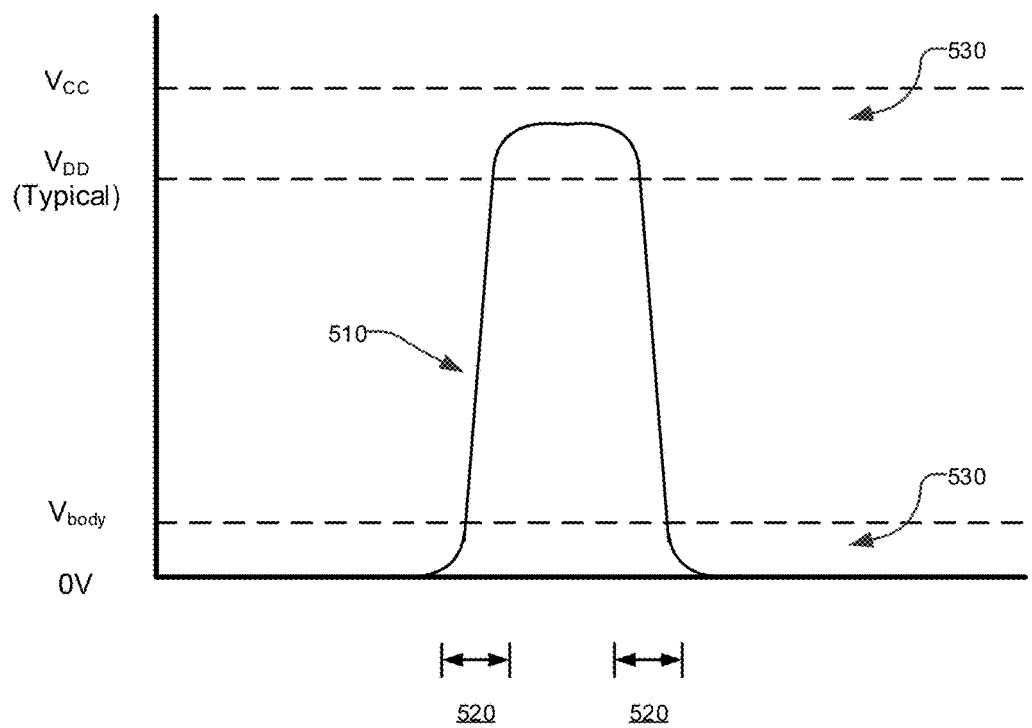
FIG. 5 is a plot illustrating the output of the high slew rate driver circuit of FIG. 4, in accordance with an embodiment of the present disclosure.

The use of BJTs in driver circuit 310 results in an improved gate drive signal 350 (compared to the gate drive signal generated by an FET driver), as illustrated in FIG. 5. As can be seen in FIG. 5, the slope, or slew rate, 510 of the gate drive signal through the nonlinear transition regions is steeper, and thus the FET of mixer circuit 320 remains in this nonlinear state for a shorter period of time 520 compared to the time period 220 of FIG. 2. In some embodiments, the improved slew rate may exceed 50 Gigavolts/second. The faster slew rate 510, is also beneficial because it allows the FET mixer circuit 320 to maintain an improved conduction duty cycle at higher frequencies, thus increasing the frequency range of operation of the mixer circuit. In some embodiments, the increased frequency range of operation may extend into the tens of gigahertz range or higher.

Additionally, the BJT driver circuit can generate a larger amplitude swing (compared to FET drivers) in the gate drive signal. As shown in FIG. 5, the gate drive signal ranges from 0 volts at the low end to near $V_{CC}$ volts (the driver BJT collector supply voltage) at the high end. This amplitude voltage swing provides a gate overvoltage condition 530. More specifically, at the low end, 0 volts is below the mixer FET biased body voltage ($V_{body}$), and at the high end, $V_{CC}$ is above the typical $V_{DD}$ supply voltage of the mixer FET. The gate overvoltage condition is advantageous because it drives the FETs further into the triode region of operation, which improves linearity during the conduction stage of the switching cycle.

In some embodiments, the driver circuit 310 and the mixer circuit 320 are integrated on a Bipolar-CMOS (BiCMOS) integrated circuit device. The CMOS FET 320 may be disposed in an isolation well 330 which is configured to enable the body voltage of the FET to float relative to the ground voltage of the IC device. In some embodiments, the isolation well is configured as a dielectric ring insulator. In some embodiments, the isolation well is configured as a triple well parasitic reverse biased diode.

In some embodiments, a heterogeneous integration technique may be employed in which a bipolar-only process is coupled with a CMOS-only process through a bonding process that achieves the benefits of a BiCMOS process. Such heterogenous integration techniques allow for the combination of a CMOS node with a bipolar process, such as, for example, silicon CMOS with indium phosphide bipolar. Thus, in some embodiments, the bipolar and CMOS need not be on the same wafer, as would be the case with a BiCMOS process.

Figure 3B:
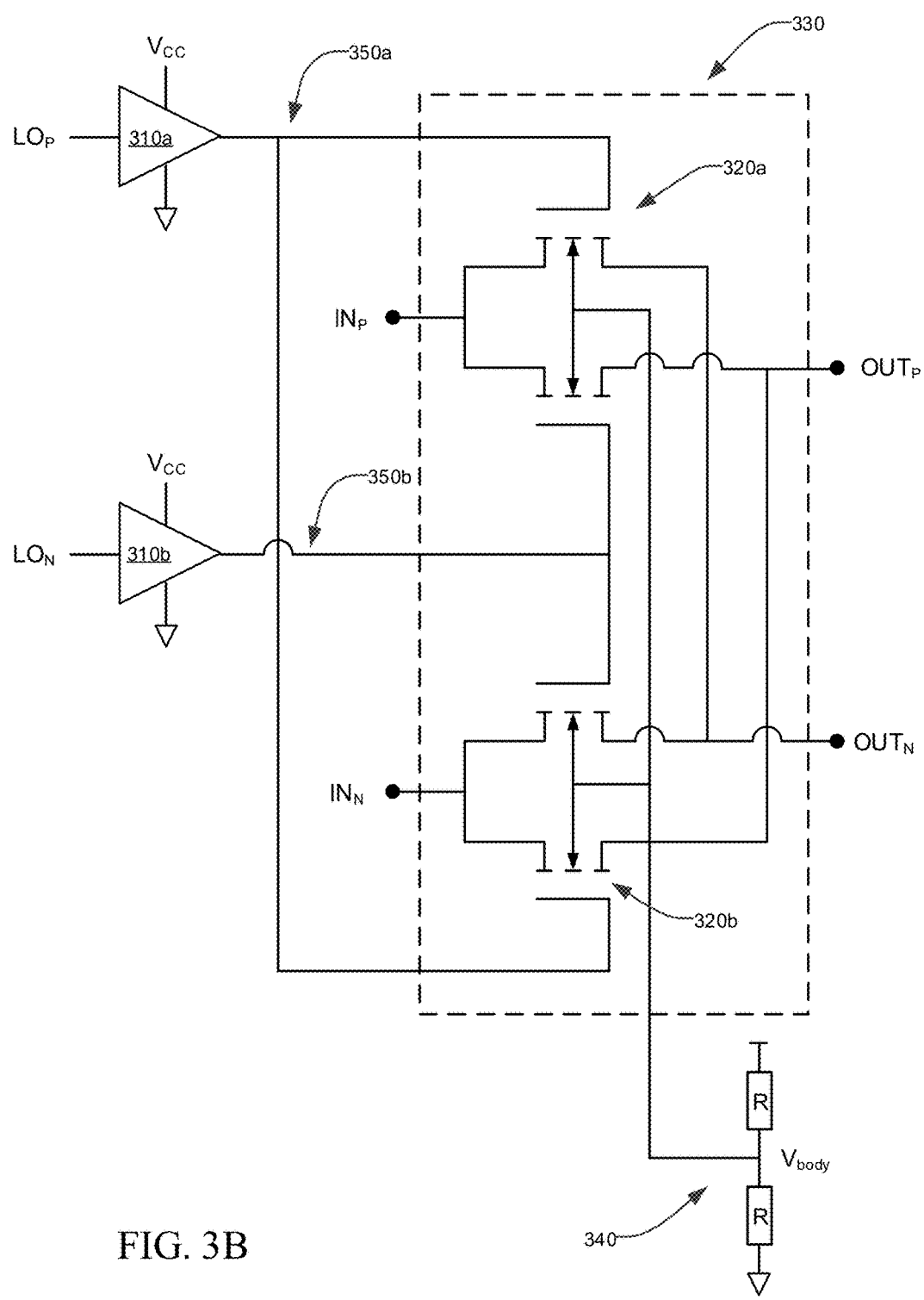
FIG. 3B is a circuit diagram of a mixer device with a high slew rate driver circuit, configured in accordance with another embodiment of the present disclosure.

FIG. 3B is a circuit diagram of another mixer device 360, configured in accordance with certain of the embodiments disclosed herein. The mixer device 360 is similar to mixer device 300 described above, but is configured to operate in a differential mode, for example as a double balanced switching mixer. A double balanced switching mixer alternately inverts or does not invert the input signal, depending on the phase of the LO, which results in a frequency shift of the input signal by the frequency of the LO (along with the generation of harmonics that can later be filtered out). Mixer device 360 is shown to include BJT driver circuits 310a and 310b, and FET mixer circuits 320a and 320b. Also shown is voltage biasing circuit 340 configured to provide a voltage bias to the bodies of FET mixer circuits 320a, 320b.

BJT driver circuit 310a is configured to accept a positive side of the differential LO signal ($LO_P$) and generate a squared-up signal 350a to drive the gates of one side of each differential pair of FET mixer circuits 320a and 320b. BJT driver circuit 310b is configured to accept a negative side of the differential sinusoidal LO signal ($LO_N$) and generate a squared-up gate drive signal 350b to drive the gates of the other side of each differential pair of FET mixer circuits 320a and 320b. BJT driver circuits 310a and 310b provide the improved gate drive signals (e.g., larger amplitude and faster slew rate) as described previously in connection with the non-differential mixer device 300.

Differential FET mixer circuit 320a is configured to mix the gate drive signals 350a and 350b with the positive side of the differential input signal ($IN_P$) to generate components of the differential mixed output signals ($OUT_P$ and $OUT_N$). Differential FET mixer circuit 320b is configured to mix the gate drive signals 350a and 350b with the negative side of the differential input signal ($IN_N$) to generate components of the differential mixed output signals ($OUT_P$ and $OUT_N$). The bodies of the differential FET mixer circuits 320a and 320b are shown to be voltage biased through voltage biasing circuit 340, and may be disposed in the isolation well 330.

In some applications, the use of a differential mode mixer device 360 may be preferable to the use of a non-differential (or single sided) mixer device 300. In either case however, the advantages provided by the disclosed BJT drivers, for example with respect to improved mixer linearity at higher frequencies resulting from improved gate drive signals, are similarly applicable.

Figure 4:
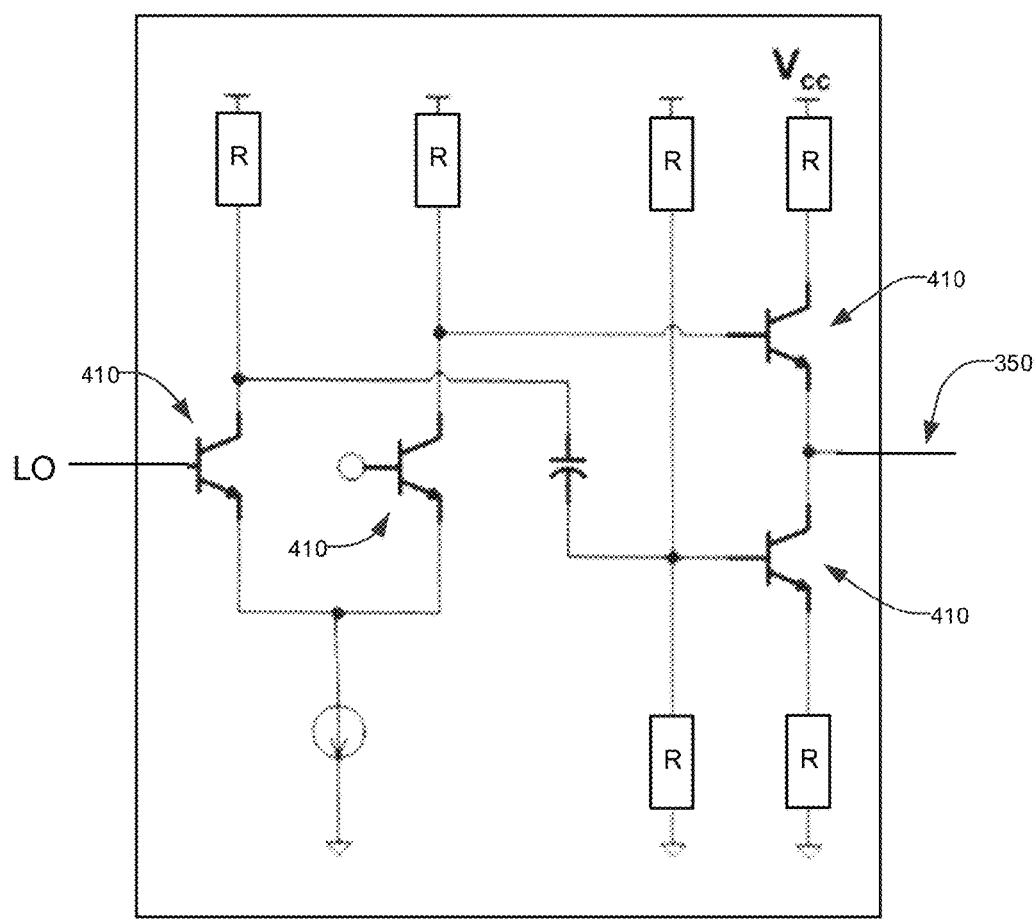
FIG. 4 is a circuit diagram of a high slew rate driver circuit, configured in accordance with an embodiment of the present disclosure.

FIG. 4 is a circuit diagram of the BJT-based driver circuit 310, configured in accordance with certain of the embodiments disclosed herein. BJT-based driver circuit 310 is configured to accept a LO signal and generate a relatively squared-up gate drive signal 350 using bipolar junction transistors 410 and other associated components. An example driver circuit schematic is shown in FIG. 4, however other embodiments may employ other known driver circuit configurations, employing BJTs, in light of the present disclosure.

In some embodiments, the driver circuit 310 is configured to employ NPN bipolar junction transistors due to difficulties associated with the fabrication of PNP transistors in a BiCMOS process. This type of NPN BJT driver circuit is also referred to as a quasi-complementary driver. In some embodiments, the NPN BJTs are fabricated as silicon-germanium (SiGe) heterojunction bipolar transistors (HBTs) which are generally capable of achieving higher switching speeds compared to other types of transistors.

Figure 6:
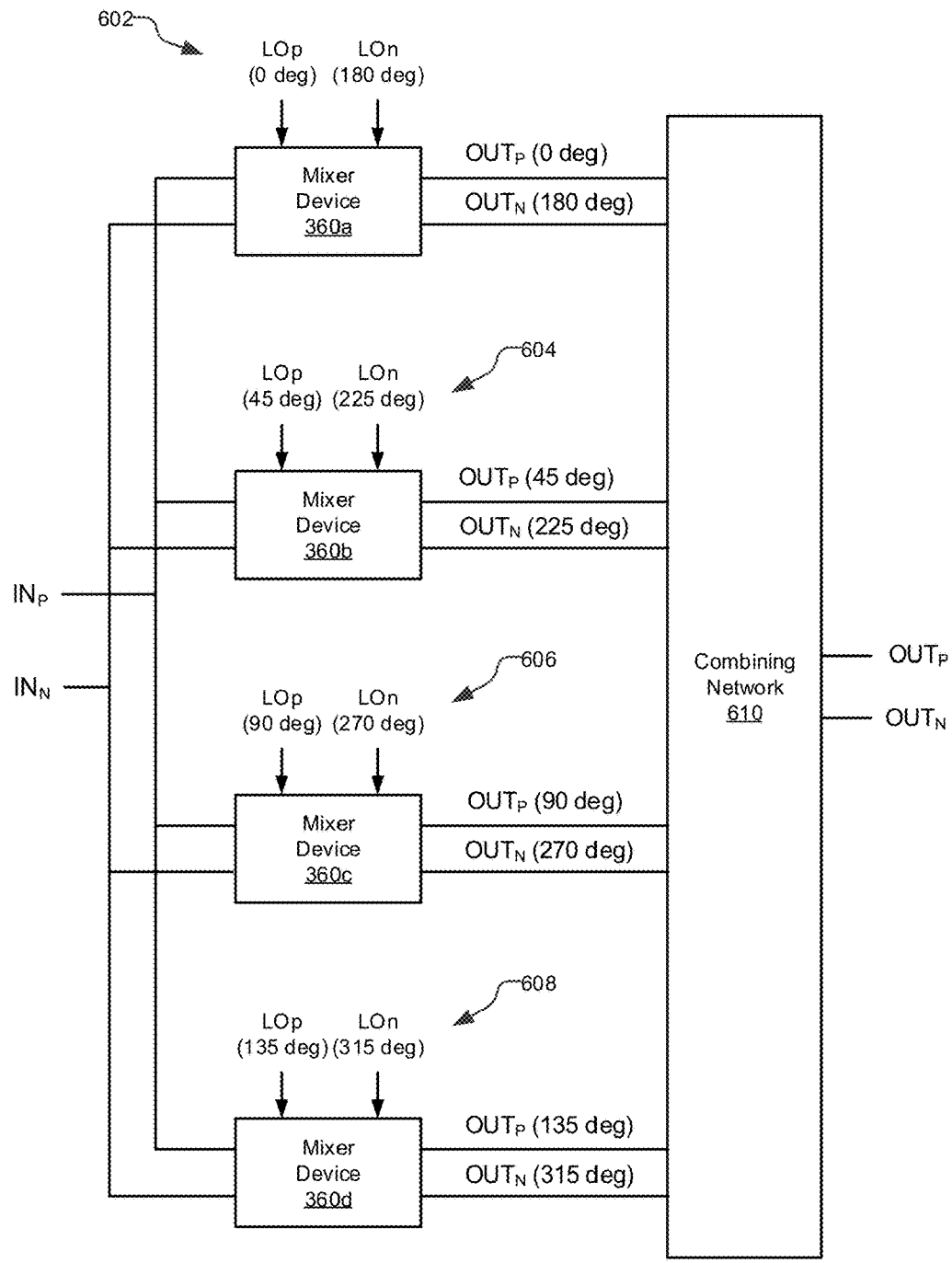
FIG. 6 is a circuit diagram of an N-path mixer device, configured in accordance with an embodiment of the present disclosure.
Figure 7:
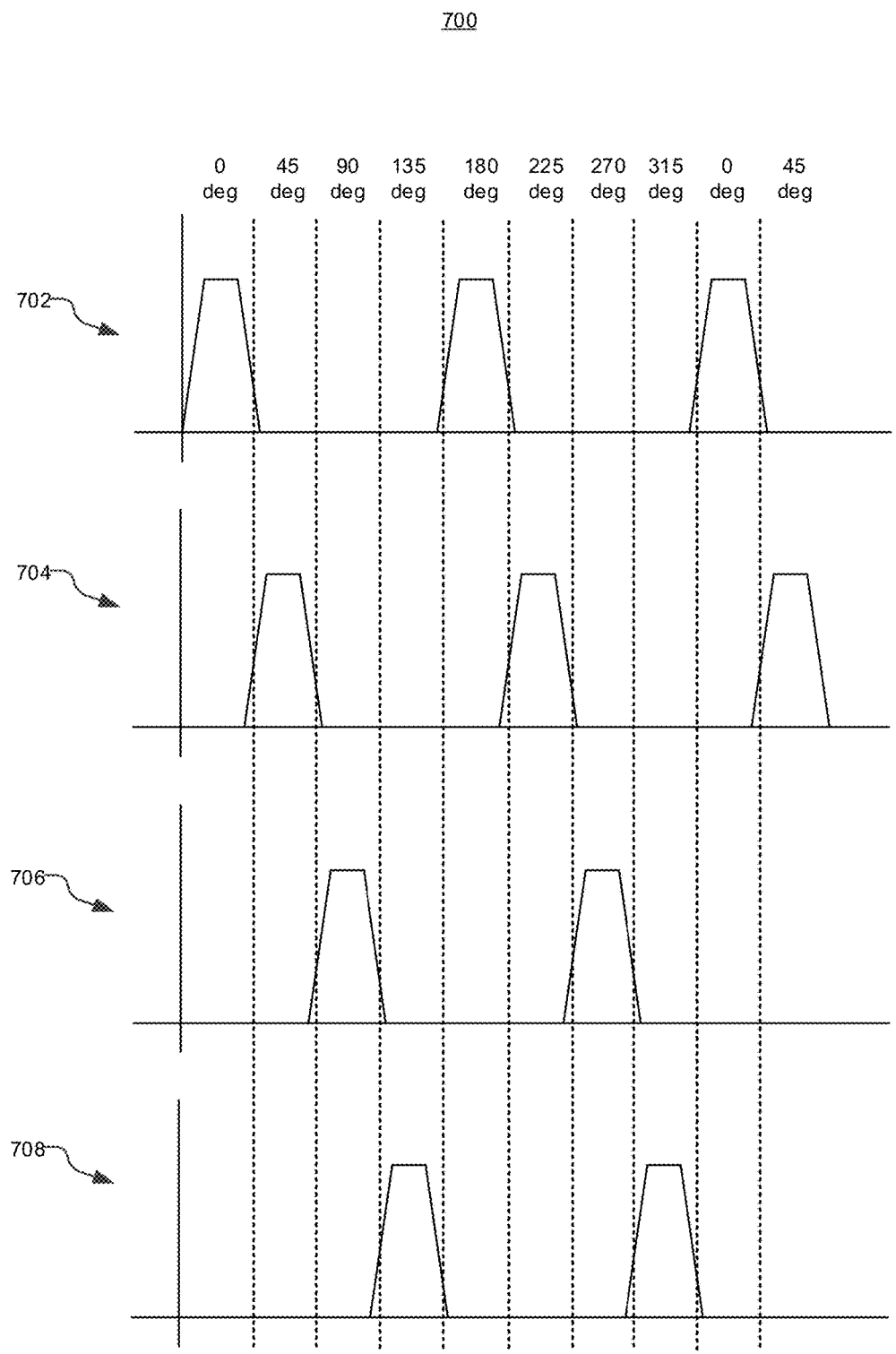
FIG. 7 is a plot illustrating gate drive signals of the N-path mixer device, in accordance with an embodiment of the present disclosure.

FIG. 6 is a circuit diagram of an N-path mixer device, configured in accordance with an embodiment of the present disclosure. In this application the duty cycle of the LO signal drops from a typical value of 50% to a lower value of 1/N. In this example, an 8-path mixer device is shown to include four mixer devices 360, each receiving a pair of positive and negative LO signals 602, 604, 606, 608, at 45° phase offsets, for which the LO duty cycle is 12.5%. That is to say, the first mixer device 360a receives an $LO_P$ and $LO_N$ (602) at 0 and 180-degree phase offsets, while the second mixer device 360b receives an $LO_P$ and $LO_N$ (604) at 45 and 225-degree phase offsets, and so on with LOs 606 and 608. This results in gate drive signal pulses that are significantly narrower (in this example, one quarter of the width: 50% down to 12.5%), and thus benefit from the improved high frequency performance and faster slew rate of the disclosed driver circuits. FIG. 7 illustrates the gate drive signals of this 8-path mixer device, where gate drive signals 702 are generated from LO signals 602, gate drive signals 704 are generated from LO signals 604, gate drive signals 706 are generated from LO signals 606, and gate drive signals 708 are generated from LO signals 608. The eight output signals from mixer devices 360 are provided to a combining network 610 which is configured to perform some combination of weighting, filtering, and summing operations to generate a final differential output signal OUT and $OUT_N$.

Methodology

Figure 8:
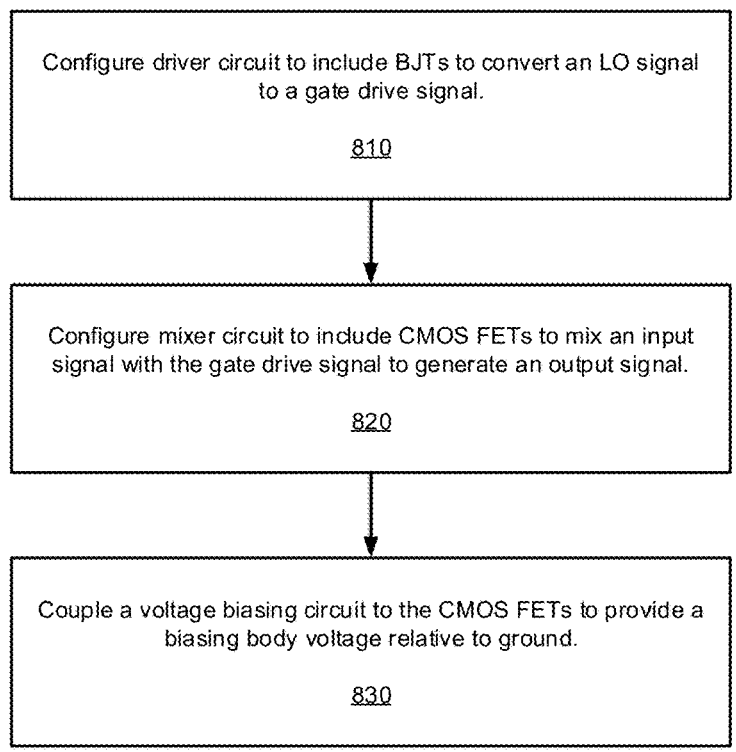
FIG. 8 is a flowchart illustrating a methodology for fabrication of a high slew rate mixer device, in accordance with an embodiment of the present disclosure.

FIG. 8 is a flowchart illustrating a methodology 800 for fabrication of a high slew rate mixer device, in accordance with certain of the embodiments disclosed herein. As can be seen, example method 800 includes a number of phases and sub-processes, the sequence of which may vary from one embodiment to another. However, when considered in the aggregate, these phases and sub-processes form a fabrication process for a mixer device in accordance with certain of the embodiments disclosed herein. These embodiments can be implemented, for example using the system architecture illustrated in FIGS. 3A, 3B and 4, as described above. However other system architectures can be used in other embodiments, as will be apparent in light of this disclosure. To this end, the correlation of the various functions shown in FIG. 8 to the specific components illustrated in FIGS. 3, 4 and 6 is not intended to imply any structural and/or use limitations. Rather other embodiments may include, for example, varying degrees of integration wherein multiple functionalities are effectively performed by one system. For example, in an alternative embodiment a single module can be used to perform all of the functions of the mixer device. Thus, other embodiments may have fewer or more modules and/or sub-modules depending on the granularity of implementation. Numerous variations and alternative configurations will be apparent in light of this disclosure.

As illustrated in FIG. 8, in one embodiment mixer device fabrication method 800 commences by configuring, at operation 810, a driver circuit to include one or more bipolar junction transistors to convert a local oscillator signal to a gate drive signal. In some embodiments, the driver circuit is configured as a quasi-complementary driver, for example, wherein the bipolar junction transistors are NPN transistors. In some embodiments, the bipolar junction transistors are fabricated as silicon-germanium heterojunction bipolar transistors (SiGe HBTs).

Next, at operation 820, a mixer circuit is coupled to the driver circuit. The mixer circuit is configured to include one or more complementary metal oxide semiconductor (CMOS) field-effect transistors (FETs) to mix an input signal with the gate drive signal to generate an output signal. The gate drive signal is coupled/applied to the gate port of the CMOS FETs.

At operation 830, a voltage biasing circuit is coupled to the bodies of the CMOS FETs to provide a biasing body voltage, relative to ground, so that the FETs can be overdriven to a negative gate voltage relative to the FET body voltage.

Of course, in some embodiments, additional operations may be performed, as previously described in connection with the system. These additional operations may include, for example, integrating the driver circuit and the mixer circuit on a Bipolar-CMOS (BiCMOS) integrated circuit device, and disposing the CMOS FETs in an isolation well configured to allow the body voltage of the CMOS FETs to float relative to a ground voltage of the IC device. The isolation well may be configured as a dielectric ring insulator or a triple well parasitic reverse biased diode. Additionally, in some embodiments, the driver circuit and the mixer circuit may be configured as differential circuits, for example, to operate on differential local oscillator signals and differential input signals, and to generate differential output signals.

Example Platform

Figure 9:
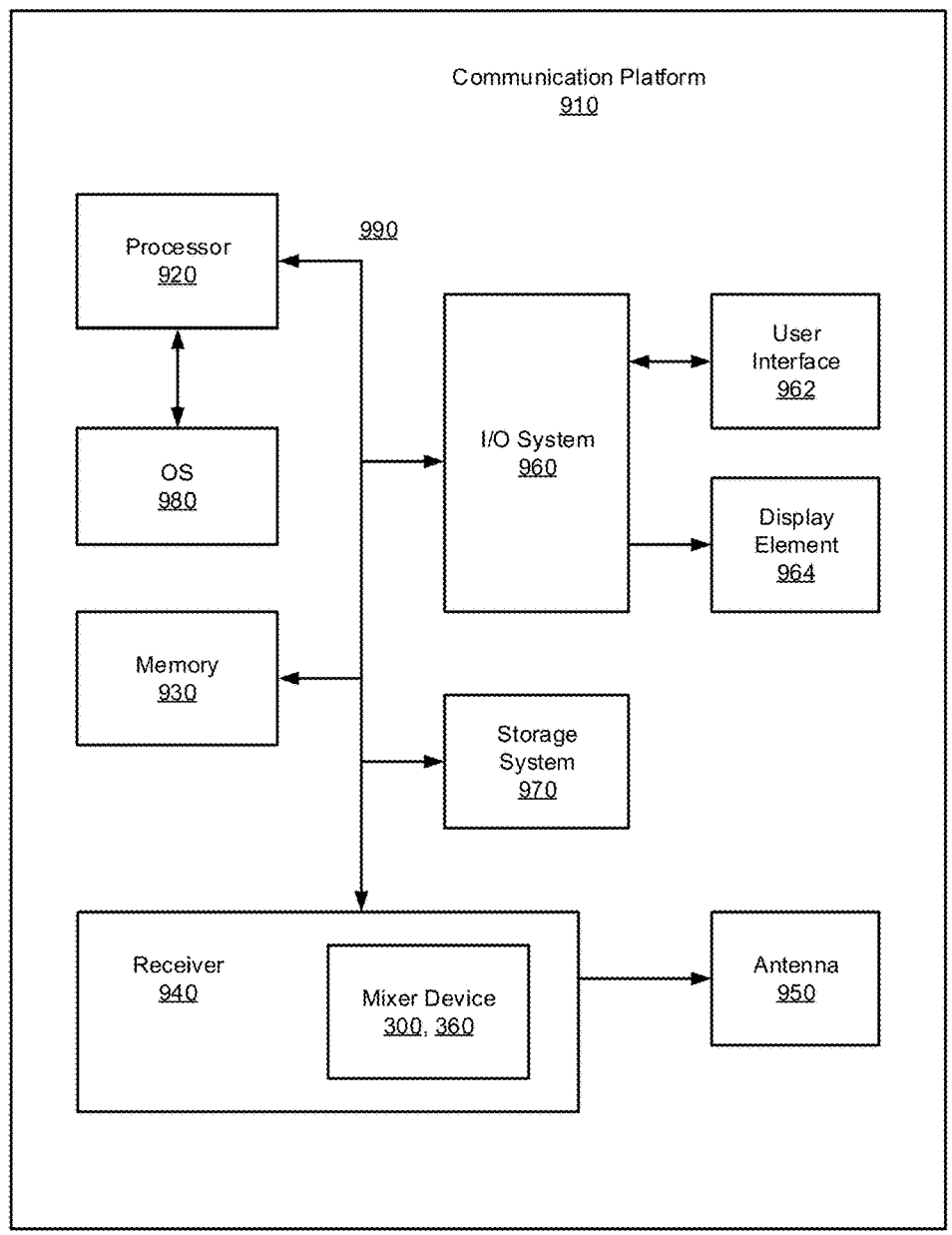
FIG. 9 is a block diagram schematically illustrating a communication platform employing the high slew rate mixer device, in accordance with an embodiment of the present disclosure.

FIG. 9 is a block diagram 900 schematically illustrating a communication platform 910 including a receiver 940 which employs the mixer device 300 or 360, in accordance with certain of the embodiments disclosed herein. In some embodiments, communications platform 910 may be hosted on, or otherwise be incorporated into, a radio, electronic warfare system, microwave backhaul system, data communication device, personal computer, workstation, laptop computer, tablet, portable computer, and so forth. Any combination of different devices may be used in certain embodiments.

In some embodiments, platform 910 may comprise any combination of a processor 920, a memory 930, a receiver 940 employing mixer device 300 or 360, antenna 950, an input/output (I/O) system 960, a user interface 962, a display element 964, and a storage system 970. As can be further seen, a bus and/or interconnect 990 is also provided to allow for communication between the various components listed above and/or other components not shown. Other componentry and functionality not reflected in the block diagram of FIG. 9 will be apparent in light of this disclosure, and it will be appreciated that other embodiments are not limited to any particular hardware configuration.

Processor 920 can be any suitable processor, and may include one or more coprocessors or controllers, such as an audio processor, a graphics processing unit, or hardware accelerator, to assist in control and processing operations associated with platform 910. In some embodiments, the processor 920 may be implemented as any number of processor cores. The processor (or processor cores) may be any type of processor, such as, for example, a microprocessor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. Processor 920 may be implemented as a complex instruction set computer (CISC) or a reduced instruction set computer (RISC) processor.

Memory 930 can be implemented using any suitable type of digital storage including, for example, flash memory and/or random access memory (RAM). In some embodiments, the memory 930 may include various layers of memory hierarchy and/or memory caches as are known to those of skill in the art. Memory 930 may be implemented as a volatile memory device such as, but not limited to, a RAM, dynamic RAM (DRAM), or static RAM (SRAM) device. Storage system 970 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage 970 may comprise technology to increase the storage performance enhanced protection for valuable digital media when multiple hard drives are included.

Processor 920 may be configured to execute an Operating System (OS) 980 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS). As will be appreciated in light of this disclosure, the techniques provided herein can be implemented without regard to the particular operating system provided in conjunction with platform 910, and therefore may also be implemented using any suitable existing or subsequently-developed platform.

I/O system 960 may be configured to interface between various I/O devices and other components of platform 910. I/O devices may include, but not be limited to, user interface 962 and display element 964. User interface 962 may include other devices (not shown) such as a touchpad, keyboard, mouse, microphone and speaker, trackball or scratch pad, and camera. I/O system 960 may include a graphics subsystem configured to perform processing of images for rendering on the display element 964. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 920 or any chipset of platform 910.

It will be appreciated that in some embodiments, the various components of platform 910 may be combined or integrated in a system-on-a-chip (SoC) architecture. In some embodiments, the components may be hardware components, firmware components, software components or any suitable combination of hardware, firmware or software.

Receiver 940 is configured to receive signals with desired frequency characteristics through antenna 950, for example as part of an electronic warfare system, a microwave receiver system, a radio, or other suitable application. Receiver 940 may employ single sided mixer device 300 and/or differential mixer device 360, which is configured to mix the RF input signal from the antenna with a local oscillator signal to generate an intermediate frequency signal or baseband signal as an output, with improved linearity and dynamic range as previously described. In some embodiments, receiver 940 may also include RF components such as amplifiers, filters, and the like. Filters may be configured to remove selected harmonics, generated during the mixing process, from the output signal. Mixer device 300 or 360 may include any or all of the components and features illustrated in FIGS. 3A, 3B, and 4, as described above.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the methodologies disclosed herein to be implemented. Other componentry and functionality not reflected in the illustrations will be apparent in light of this disclosure, and it will be appreciated that other embodiments are not limited to any particular hardware or software configuration. Thus, in other embodiments platform 910 may comprise additional, fewer, or alternative subcomponents as compared to those included in the example embodiment of FIG. 9.

The aforementioned non-transitory computer readable medium may be any suitable medium for storing digital information, such as a hard drive, a server, a flash memory, and/or random access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). In some embodiments, the hardware may be modeled or developed using hardware description languages such as, for example Verilog or VHDL. Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CD-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, or one or more embedded routines configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads or parallel processes in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smart phones, and other processor-based or functional systems. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

One example embodiment of the present disclosure provides a mixer device. The mixer device includes: a driver circuit including one or more bipolar junction transistors to convert a local oscillator signal to a gate drive signal; and a mixer circuit including one or more complementary metal oxide semiconductor (CMOS) field-effect transistors (FETs) to mix an input signal with the gate drive signal to generate an output signal, the gate drive signal applied to a gate port of the one or more CMOS FETs.

In some cases, the driver circuit is configured as a quasi-complementary driver wherein the bipolar junction transistors are NPN bipolar junction transistors. In some cases, the driver circuit and the mixer circuit are configured as differential circuits. In some cases, the bipolar junction transistors are silicon-germanium heterojunction bipolar transistors (SiGe HBTs). In some cases, the mixer device further includes a voltage biasing circuit to provide a biasing body voltage to the one or more CMOS FETs, the biasing voltage to bias the one or more CMOS FETs relative to a ground voltage. In some such cases, the driver circuit is further configured to generate the gate drive signal to drive the one or more CMOS FETs below the body voltage. In some cases, the driver circuit is further configured to generate the gate drive signal to drive the one or more CMOS FETs into a triode region of operation. In some cases, the driver circuit and the mixer circuit are integrated on a Bipolar-CMOS (BiCMOS) integrated circuit device. In some such cases, the one or more CMOS FETs are disposed in an isolation well configured to enable a body voltage of the one or more CMOS FETs to float relative to a ground voltage of the IC device. In some such cases, the isolation well is configured as a dielectric ring insulator. In some such cases, the isolation well is configured as a triple well parasitic reverse biased diode. In some cases, the mixer device further includes a filter circuit to filter out selected harmonics from the output signal, the harmonics generated by the mixing.

Another example embodiment of the present disclosure provides a receiver system. The receiver system includes an antenna to receive a radio frequency (RF) signal; a mixer device comprising a driver circuit including one or more bipolar junction transistors to convert a local oscillator signal to a gate drive signal, and a mixer circuit including one or more complementary metal oxide semiconductor (CMOS) field-effect transistors (FETs) to mix the received RF signal with the gate drive signal to generate an intermediate frequency signal, the gate drive signal applied to a gate port of the one or more CMOS FETs; and a filter circuit to filter out selected harmonics from the intermediate frequency signal, the harmonics generated by the mixing. In some cases, the receiver system further includes a filter circuit to filter out selected harmonics from the intermediate frequency signal, the harmonics generated by the mixing.

Another example embodiment of the present disclosure provides a method for fabricating a mixer device. The method includes: configuring a driver circuit to include one or more bipolar junction transistors to convert a local oscillator signal to a gate drive signal; and configuring a mixer circuit, coupled to the driver circuit, to include one or more complementary metal oxide semiconductor (CMOS) field-effect transistors (FETs) to mix an input signal with the gate drive signal to generate an output signal, the gate drive signal applied to a gate port of the one or more CMOS FETs.

In some cases, the method further includes configuring the driver circuit as a quasi-complementary driver wherein the bipolar junction transistors are NPN bipolar junction transistors. In some cases, the method further includes fabricating the bipolar junction transistors as silicon-germanium heterojunction bipolar transistors (SiGe HBTs). In some cases, the method further includes coupling a voltage biasing circuit to the one or more CMOS FETs to provide a biasing body voltage to the CMOS FETs, relative to a ground voltage. In some such cases, the method further includes configuring the driver circuit to generate the gate drive signal to drive the one or more CMOS FETs below the body voltage, and to generate the gate drive signal to drive the one or more CMOS FETs into a triode region of operation. In some cases, the method further includes integrating the driver circuit and the mixer circuit on a Bipolar-CMOS (BiCMOS) integrated circuit device, and disposing the one or more CMOS FETs in an isolation well configured to enable a body voltage of the one or more CMOS FETs to float relative to a ground voltage of the IC device.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:
1. A mixer device comprising:
a driver circuit including one or more bipolar junction transistors to convert a local oscillator signal to a gate drive signal; and
a mixer circuit including one or more complementary metal oxide semiconductor (CMOS) field-effect transistors (FETs) to mix an input signal with the gate drive signal to generate an output signal, the gate drive signal applied to a gate port of the one or more CMOS FETs.

2. The mixer device of claim 1, wherein the driver circuit is configured as a quasi-complementary driver wherein the bipolar junction transistors are NPN bipolar junction transistors.

3. The mixer device of claim 1, wherein the driver circuit and the mixer circuit are configured as differential circuits.

4. The mixer device of claim 1, wherein the bipolar junction transistors are silicon-germanium heterojunction bipolar transistors (SiGe HBTs).

5. The mixer device of claim 1, further comprising a voltage biasing circuit to provide a biasing body voltage to the one or more CMOS FETs, the biasing voltage to bias the one or more CMOS FETs relative to a ground voltage.

6. The mixer device of claim 5, wherein the driver circuit is further to generate the gate drive signal to drive the one or more CMOS FETs below the body voltage.

7. The mixer device of claim 1, wherein the driver circuit is further to generate the gate drive signal to drive the one or more CMOS FETs into a triode region of operation.

8. The mixer device of claim 1, wherein the driver circuit and the mixer circuit are integrated on a Bipolar-CMOS (BiCMOS) integrated circuit (IC) device.

9. The mixer device of claim 8, wherein the one or more CMOS FETs are disposed in an isolation well configured to enable a body voltage of the one or more CMOS FETs to float relative to a ground voltage of the IC device.

10. The mixer device of claim 9, wherein the isolation well is configured as a dielectric ring insulator.

11. The mixer device of claim 9, wherein the isolation well is configured as a triple well parasitic reverse biased diode.

12. The mixer device of claim 1, further comprising a filter circuit to filter out selected harmonics from the output signal, the harmonics generated by the mixing.

13. A receiver system comprising:
an antenna to receive a radio frequency (RF) signal;
a mixer device including
a driver circuit including one or more bipolar junction transistors to convert a local oscillator signal to a gate drive signal, and
a mixer circuit including one or more complementary metal oxide semiconductor (CMOS) field-effect transistors (FETs) to mix the received RF signal with the gate drive signal to generate an intermediate frequency signal, the gate drive signal applied to a gate port of the one or more CMOS FETs; and
a filter circuit to filter out selected harmonics from the intermediate frequency signal, the harmonics generated by the mixing.

14. The receiver system of claim 13, wherein the driver circuit and the mixer circuit are integrated on a Bipolar-CMOS (BiCMOS) integrated circuit (IC) device.

15. A method for fabricating a mixer device, the method comprising:
configuring a driver circuit to include one or more bipolar junction transistors to convert a local oscillator signal to a gate drive signal; and
configuring a mixer circuit, coupled to the driver circuit, to include one or more complementary metal oxide semiconductor (CMOS) field-effect transistors (FETs) to mix an input signal with the gate drive signal to generate an output signal, the gate drive signal applied to a gate port of the one or more CMOS FETs.

16. The method of claim 15, further comprising configuring the driver circuit as a quasi-complementary driver wherein the bipolar junction transistors are NPN bipolar junction transistors.

17. The method of claim 15, further comprising fabricating the bipolar junction transistors as silicon-germanium heterojunction bipolar transistors (SiGe HBTs).

18. The method of claim 15, further comprising coupling a voltage biasing circuit to the one or more CMOS FETs to provide a biasing body voltage to the CMOS FETs, relative to a ground voltage.

19. The method of claim 18, further comprising configuring the driver circuit to generate the gate drive signal to drive the one or more CMOS FETs below the body voltage, and to generate the gate drive signal to drive the one or more CMOS FETs into a triode region of operation.

20. The method of claim 15, further comprising integrating the driver circuit and the mixer circuit on a Bipolar-CMOS (BiCMOS) integrated circuit (IC) device, and disposing the one or more CMOS FETs in an isolation well configured to enable a body voltage of the one or more CMOS FETs to float relative to a ground voltage of the IC device.

* * * * *